United States Patent [19]

Hwang

[11] Patent Number: 5,618,746

[45] Date of Patent: Apr. 8, 1997

[54] METHOD FOR MANUFACTURING A CAPACITOR OF SEMICONDUCTOR DEVICE HAVING DIFFUSION-BLOCKING FILMS

[75] Inventor: Cheol-seong Hwang, Seongnam, Rep. of Korea

[73] Assignee: Samsung Electronics Co., Ltd., Suwon, Rep. of Korea

[21] Appl. No.: 524,287

[22] Filed: Sep. 6, 1995

[30] Foreign Application Priority Data

May 30, 1995 [KR] Rep. of Korea .................... 94-13959

[51] Int. Cl.$^6$ .............................. H01L 21/70; H01L 27/00
[52] U.S. Cl. ............................. 438/3; 438/396; 438/253; 438/240
[58] Field of Search .................................. 437/191, 195, 437/193, 47, 52, 200, 201, 60, 919

[56] References Cited

U.S. PATENT DOCUMENTS

| 5,275,963 | 1/1994 | Cederbaum et al. | 437/48 |
| 5,386,382 | 1/1995 | Ahn | 437/52 |
| 5,536,672 | 7/1996 | Miller et al. | 437/52 |

Primary Examiner—Jey Tsai

Attorney, Agent, or Firm—Cushman Darby & Cushman, IP Group of Pillsbury Madison & Sutro LLP

[57] ABSTRACT

A capacitor of a semiconductor device employing a material having a high dielectric constant or ferroelectric properties and a method for manufacturing the same are provided. The capacitor includes a plug film formed on a semiconductor substrate where a transistor having a gate electrode, a source region and a drain region is formed. An insulation film having a contact hole is formed on the plug film and a first diffusion-blocking film is formed on the plug film in the contact hole. A second diffusion-blocking film is then formed on the surface of the first diffusion-blocking film, the surface of the insulating film and on the sidewalls of the contact hole. A third diffusion-blocking film is formed on the second diffusion-blocking film and a first conductive layer is formed on the third diffusion-blocking film so as to be used for a storage electrode. A dielectric layer is formed on the first conductive layer, and a second conductive layer is formed on the dielectric layer to be used as a plate electrode. An iridium film or a ruthenium film is employed as a diffusion-blocking film that has a high conductivity and prevents silicon diffusion, to thereby obtain a larger electrostatic capacity in a small effective area and enable higher integration of a semiconductor memory device and enhance product reliability.

9 Claims, 3 Drawing Sheets

METHOD FOR MANUFACTURING A CAPACITOR OF SEMICONDUCTOR DEVICE HAVING DIFFUSION-BLOCKING FILMS

BACKGROUND OF THE INVENTION

The present invention relates to a capacitor of a semiconductor device and a method for manufacturing the same, and more particularly, to a capacitor of a semiconductor device using a material having a high dielectric constant or ferroelectric properties.

As semiconductor memory device becomes more highly integrated, a capacitor having greater electrostatic capacity while occupying a reduced area is needed. To achieve this, one or more of three basic approaches may be used: the effective area of the capacitor may be expanded, its dielectric layer may be made thinner or a material having a higher dielectric constant may be chosen as the dielectric layer. Among these alternatives, the expansion of the capacitor's effective area causes difficulty in manufacturing, which in turn leads to trouble in application to an actual semiconductor device. On the other hand, methods for making a thin dielectric layer of nitride and oxide films have leakage current and reliability problems. However, if a material having a high dielectric constant is used for the dielectric layer, conventional structures may be used to increase cell capacitance. Thus, the third approach, increasing the dielectric constant itself by using a material having a high dielectric constant or ferroelectric properties as the dielectric layer, has received much attention recently as a method to solve both of the above-mentioned problems.

However, when a material with a high dielectric constant is employed, a polycrystalline silicon film cannot be used as a capacitor electrode since silicon film oxidizes easily and forms an oxide layer having low dielectric constant at the contacting interface, thus cancelling the desired effects. Accordingly, as a new electrode material, platinum (Pt) or other precious metal (hereinafter referred to as a "non-oxidizable metal"), which does not oxidize upon contact with the material of high dielectric constant or ferroelectric properties, is employed. Still, when the non-oxidizable metal comes into contact with a polysilicon substrate or plug, a silicidation reaction occurs at the contacting interface, whereby silicon is diffused into the non-oxidizable metal and adversely affects the dielectric layer. Accordingly, a diffusion blocking film that suppresses the silicidation reaction is required.

FIG. 1 shows the structure of a conventional capacitor of a semiconductor device, in which the above dielectric material having a high dielectric constant or ferroelectric properties is used together with a non-oxidizable metal electrode and a diffusion blocking film. Here, a field oxide film 3 for defining an active region is formed on a semiconductor substrate 1, for example, a silicon substrate. A source region 5a and a drain region 5b are formed near the surface of substrate 1, and a gate insulation film 7 and a gate electrode 9 are formed thereon, to thereby form a transistor. Then, a first insulation film 11 for insulating the gate electrode 9 is formed. First and second polysilicon plugs 13 and 17 are connected to the source region 5a. Here, a second insulation film 15 has a contact hole for exposing the surface of the first polysilicon plug 13. A first diffusion blocking film 19 of titanium silicide is deposited on the second polysilicon plug 17. Second and third diffusion blocking films 21 and 23 of titanium nitride and titanium, respectively, are formed on the first diffusion blocking film 19 and the second insulation film 15. Finally, a storage electrode 25 comprising a non-oxidizable metal, a dielectric layer 27 comprising by a material having high dielectric constant/ferroelectric properties and a plate electrode 29 comprising a non-oxidizable metal are sequentially deposited on the third diffusion blocking film 23.

The above-described conventional capacitor that comprises a non-oxidizable metal as an electrode, employs a titanium nitride film as a silicon-diffusion blocking film for preventing the silicide reaction of the non-oxidizable metal. Although the titanium nitride film exhibits excellent diffusion-preventing characteristics with respect to silicon, it becomes oxidized during a subsequent deposition process for forming a thin-film dielectric layer of the above-described dielectric material, to thereby lose the structural and electrical integrity of the finished device. Accordingly, if the titanium nitride film is employed as a diffusion-blocking film, the capacitor has problems in actual use.

SUMMARY OF THE INVENTION

Accordingly, it is an object of the present invention to provide a capacitor of a semiconductor memory device having a diffusion-blocking film, whereby the above-described problems are solved.

It is another object of the present invention to provide a method for manufacturing the above capacitor.

To accomplish the above object, there is provided a capacitor of a semiconductor device comprising: a plug film formed on a semiconductor substrate where a transistor including a gate electrode, a source and drain region is formed; an insulation film having a contact hole formed on the plug film; a first diffusion-blocking film formed on the plug film in the contact hole; a second diffusion-blocking film formed on the surface of the first diffusion-blocking film and on the surface and sidewalls of the insulation film; a third diffusion-blocking film formed on the second diffusion-blocking film; a first conductive layer formed on the third diffusion-blocking film, to be used as a storage electrode; a dielectric layer formed on the first conductive layer; and a second conductive layer formed on the dielectric layer, to be used as a plate electrode.

The plug film is connected to the source region, and the first diffusion-blocking film comprises a titanium-silicide film, The second diffusion-blocking film can comprise an iridium film and the third diffusion-blocking film can comprise an iridium oxide film. The second diffusion-blocking film can comprise a ruthenium film, and the third diffusion-blocking film can comprise a ruthenium oxide film.

The first and second conductive layers can comprise non-oxidizable metal layers. The dielectric layer can comprise a film formed by employing at least one selected a material from the group comprising BSTO [(Ba$_x$Sr$_{1-x}$)TiO$_3$] compounds, STO(SrTiO$_3$) compounds, Ta$_2$O$_3$, a PZT [Pb(Zr$_x$Ti$_{1-x}$)O$_3$] film and a Y-1 (SrBi$_2$Ta$_2$O$_9$) material.

To accomplish another object of the present invention, there is provided a method for manufacturing a capacitor of a semiconductor device comprising the steps of: forming a gate insulation film and a gate electrode on a semiconductor substrate; ion-implanting to form a source and drain region on the semiconductor substrate, employing the gate electrode as a mask; forming a first insulation film for insulating the gate electrode; forming a plug film on the source region; forming a second insulation film having a contact hole on the plug film; forming a first diffusion-blocking film formed on the plug film in the contact hole; forming a second diffusion-blocking film on the surface of the first diffusion-blocking film and on the surface and sidewalls of the second insulation film; forming a third diffusion-blocking film on the second diffusion-blocking film; forming a first conductive layer on the third diffusion-blocking film, to be used as a storage electrode; forming a dielectric layer on the first conductive layer; and forming a second conductive layer on the dielectric layer, to be used as a plate electrode.

The first diffusion-blocking film is formed of a titanium-silicide film, the second diffusion-blocking film is formed of an iridium film, and the third diffusion-preventing film is formed of an iridium oxide film. The second diffusion-blocking film can be formed of a ruthenium film, and the third diffusion-blocking film can be formed of a ruthenium oxide film.

The first and second conductive layers are formed of a non-oxidizable metal layer. The dielectric layer can comprise a film formed by employing at least one material selected from the group comprising BSTO compounds, STO compounds, $Ta_2O_3$, a PZT film and a Y-1 material. The third diffusion-blocking film is formed by oxidizing the surface of the second diffusion-blocking film, by performing a reactive sputtering on the oxide film, or by employing an MOCVD method.

According to the present invention, an iridium film or a ruthenium film is employed as a diffusion-blocking film that has a high conductivity and prevents silicon diffusion. Thus, a larger electrostatic capacity can be obtained in a smaller effective area. As a result, a semiconductor memory device can be highly integrated and product reliability can be enhanced.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

The capacitor of the present invention is structured as follows.

Figure 1:
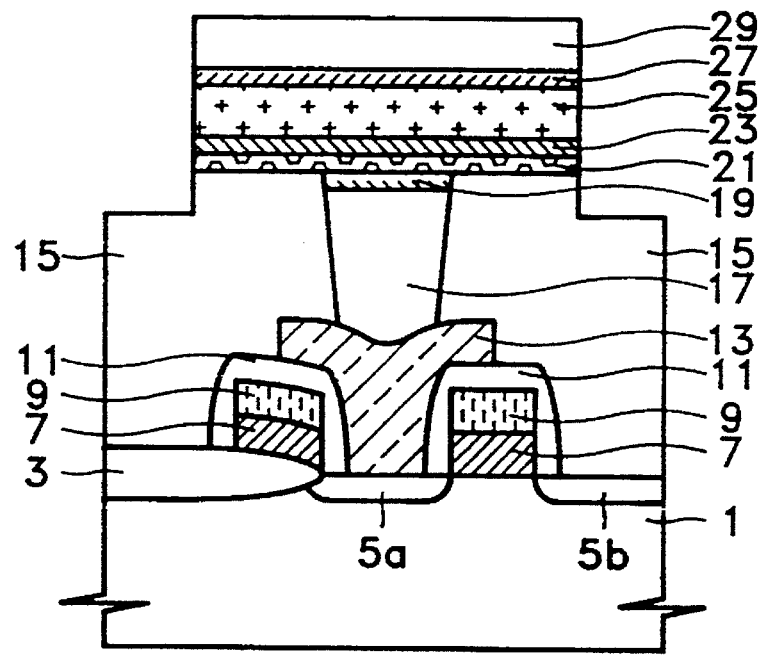
FIG. 1 is a section view of a conventional capacitor of a semiconductor device.
Figure 2:
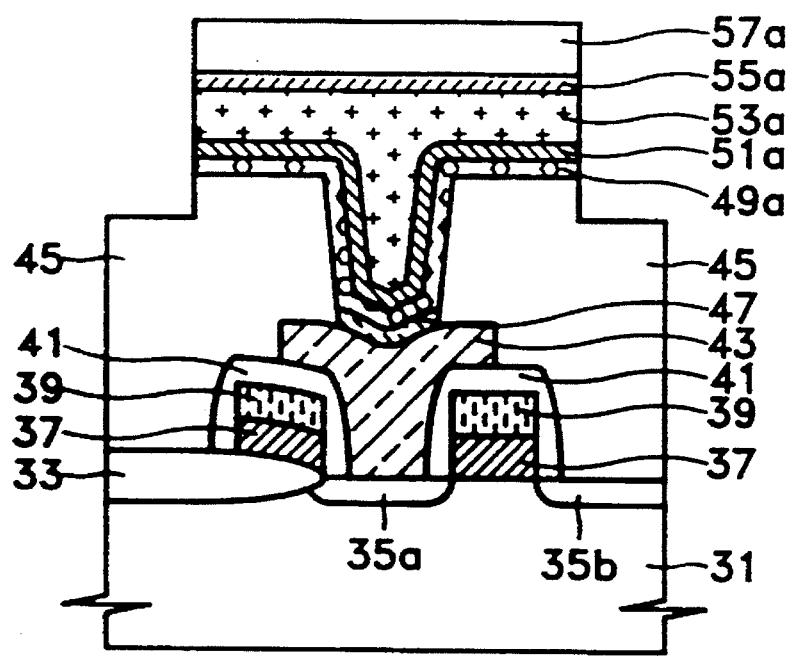
FIG. 2 is a section view of a capacitor of a semiconductor device of the present invention.

FIG. 2 is a section view of a capacitor of a semiconductor device of the present invention. Here, a field oxide film 33 for defining an active region is formed on a semiconductor substrate 31, for example, a silicon substrate. Source region 35a and drain region 35b are formed near the surface of the substrate 31, and a gate insulation film 37 and a gate electrode 39 are formed thereon, to thereby form a transistor. In addition, a first insulation film 41 for insulating the gate electrode 37 is formed, a plug film 43 connected to the source region 35a and formed of a polysilicon film is formed, and a second insulation film 45 having a contact hole for exposing the surface of the plug film 43 is formed. A first diffusion-blocking film 47 connected to the plug film 43 is formed in the contact hole. A second diffusion-blocking film 49a is formed on the surface of the first diffusion-blocking film 47 and on the surface and sidewalls of the second insulation film 45. In addition, a third diffusion-blocking film 51a, a storage electrode 53a, a dielectric layer 55a and a plate electrode 57a are sequentially deposited on the second diffusion-blocking film 49a.

The method for manufacturing the capacitor of a semiconductor device of the present invention will be described with reference to FIG. 3A to FIG. 3E, which are section views showing a method for manufacturing the capacitor shown in FIG. 2.

Figure 3A:
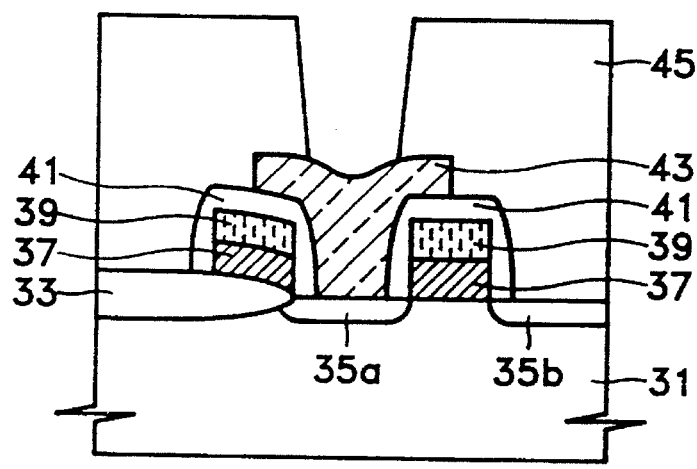
FIG. 3A to FIG. 3E are section views showing steps in a method for manufacturing the capacitor of the semiconductor device shown in FIG. 2.

FIG. 3A shows the step of forming a plug film 43 and an insulation film 45 having a contact hole on a substrate 31 where a transistor is to be formed. Here, a field oxide film 33 is formed on the semiconductor substrate 31, for example, a silicon substrate, so as to define an active region. Then, a gate insulation film 37 and a gate electrode 39 are formed on the active region, and impurities are ion-implanted by employing the gate electrode 39 as a mask, to thereby form a source region 35a and a drain region 35b. As a result, a transistor having a gate electrode 39, a gate insulation film 37, a source region 35a and a drain region 35b is formed. Then, a plug film 43 connected to the source region 35a is formed and an insulating material is deposited all over substrate 31. Then, the resultant structure is patterned, to thereby form a second insulation film 45 having a contact hole for exposing the surface of the plug film 43.

Figure 3B:
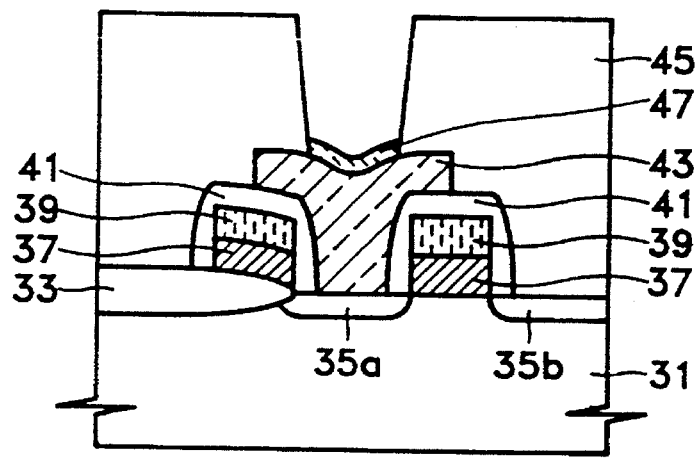

FIG. 3B shows the step of forming first a diffusion-blocking film 47 on the plug film 43. Here, a titanium film is formed all over the substrate 31 where the second insulation film 45 is formed. Then, the titanium film reacts with the plug film 43 formed of a polycrystalline silicon, to thereby form a first diffusion-blocking film 47 consisting of a $TiSi_2$ film on the plug film 43. Then, a wet etching process employing sulfuric acid is performed to remove the titanium which has not reacted with the plug film.

Figure 3C:
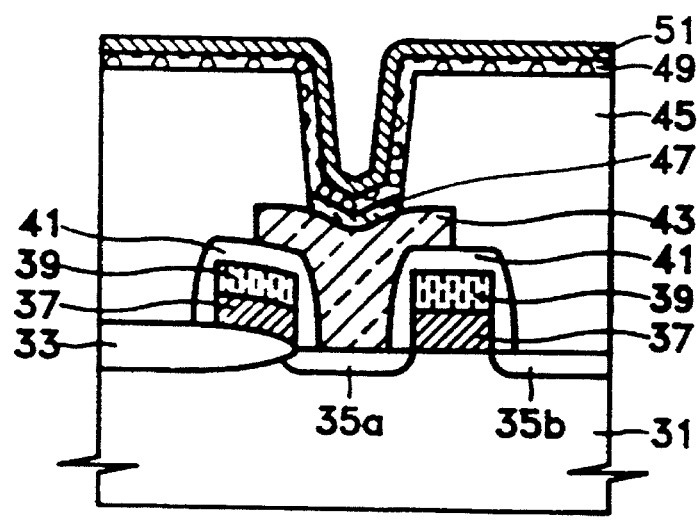

FIG. 3C shows the step of forming a second diffusion-blocking film 49 and a third diffusion-blocking film 51. Here, on the surface of the first diffusion-blocking film 47 and on the sidewalls and surface of the second insulation film 45, iridium or ruthenium is deposited to form a second diffusion-blocking film 49. Then, the surface of the second diffusion-blocking film 49 is thinly oxidized to form a third diffusion-blocking film 51 formed of iridium oxide ($IrO_2$) or ruthenium oxide ($RuO_2$).

Figure 3D:
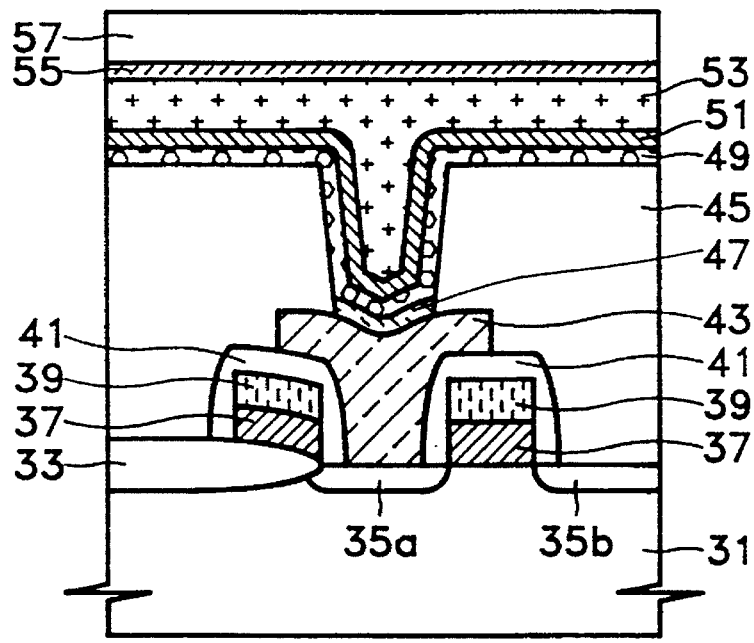

FIG. 3D shows the step of forming a first conductive layer 53 to be used for a storage electrode, a dielectric layer 55 and a second conductive layer 57 to be used for a plate electrode. Here, the first conductive layer 53, the dielectric layer 55 and the second conductive layer 57 are sequentially formed on the third diffusion-blocking film 51. First, the conductive layer 53 to be used for the storage electrode and the second conductive layer 57 to be used for a plate electrode are formed from a non-oxidizable metal such as, platinum, by employing a metal-organic chemical vapor deposition (MOCVD) method. Dielectric layer 55, also formed by the MOCVD method, is formed of a material having a high dielectric constant, for example, BSTO ($BaSrTiO_3$ compounds), STO ($SrTiO_3$ compounds) or tantalum oxide ($TazO_3$), and may also be formed of a ferroelectric material, for example, PZT (PbZrTiO compounds) or a Y-1 material.

Figure 3E:
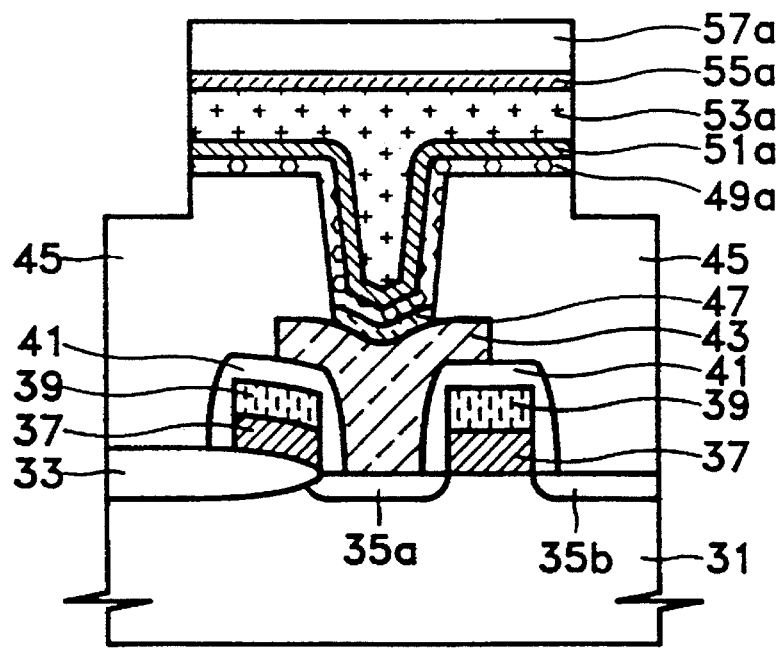

FIG. 3E shows the step of forming a storage electrode 53a, a dielectric layer 55a and a plate electrode 57a. Here, the second conductive layer 57 to be used as a plate electrode, a dielectric layer 55, the first conductive layer 53 to be used as a storage electrode, the third diffusion-blocking film 51 and the second diffusion-blocking film 49 are patterned by a photoetching process so as to form a plate electrode 57a, a patterned dielectric layer 55a, a storage electrode 53a, a patterned third diffusion-blocking film 51a and patterned second diffusion-blocking film 49a. Thus, a capacitor of the present invention is completed.

As described above, the capacitor according to the present invention has a dielectric layer formed of a material having a high dielectric constant or ferroelectric properties, and a storage electrode and a plate electrode both formed of a non-oxidizable metal. Further, the capacitor employs an iridium or ruthenium film as a diffusion-blocking film that has a high conductivity and prevents silicon diffusion. Thus, a larger electrostatic capacity can be obtained in a smaller effective area, to thereby enable higher integration of semiconductor memory device and enhance of product reliability.

What is claimed is:

1. A method for manufacturing a capacitor of a semiconductor device comprising the steps of:

forming a gate insulation film and a gate electrode on a semiconductor substrate;

ion-implanting to form a source and drain region on said semiconductor substrate, using said gate electrode as a mask;

forming a first insulation film for insulating said gate electrode;

forming a plug film on said source region;

forming a second insulation film having a contact hole on said plug film;

forming a first diffusion-blocking film formed on said plug film in said contract hole;

forming a second diffusion-blocking film on the surface of said first diffusion-blocking film, on the surface of said second insulation film, and on sidewalls of said contact hole;

forming a third diffusion-blocking film on said second diffusion-blocking film;

forming a first conductive layer on said third diffusion-blocking film, to be used as a storage electrode;

forming a dielectric layer on said first conductive layer; and forming a second conductive layer on said dielectric layer, to be used as a plate electrode.

2. A method for manufacturing a capacitor of a semiconductor device according to claim 1, wherein said first diffusion-blocking film comprises a titanium silicide film.

3. A method for manufacturing a capacitor of a semiconductor device according to claim 1, wherein said second diffusion-blocking film is formed of an iridium film and said third diffusion-blocking film is formed of an iridium-oxide film.

4. A method for manufacturing a capacitor of a semiconductor device according to claim 1, wherein said second diffusion-blocking film is formed of a ruthenium film and said third diffusion-blocking film is formed of a ruthenium-oxide film.

5. A method for manufacturing a capacitor of a semiconductor device according to claim 1, wherein said first conductive layer and said second conductive layer are formed of non-oxidizable metal layers.

6. A method for manufacturing a capacitor of a semiconductor device according to claim 1, wherein said dielectric layer is formed from at least one of BSTO compounds, STO compounds, $Ta_2O_3$, a PZT film and a Y-1 material.

7. A method for manufacturing a capacitor of a semiconductor device according to claim 8, wherein said third diffusion-blocking film is formed by oxidizing the surface of said second diffusion-blocking film.

8. A method for manufacturing a capacitor of a semiconductor device according to claim 1, wherein said third diffusion-blocking film is an oxide film formed by performing at least one of reactive sputtering and an MOCVD method.

9. A method for manufacturing a capacitor of a semiconductor device according to claim 1, wherein said first and second conductive layers are formed by an MOCVD method.

* * * * *